US011079441B2

(12) United States Patent
Endo et al.

(10) Patent No.: US 11,079,441 B2
(45) Date of Patent: Aug. 3, 2021

(54) INTERNAL RESISTANCE ESTIMATING METHOD, AND SECONDARY BATTERY CHARGING DEVICE

(71) Applicant: HONDA MOTOR CO., LTD., Tokyo (JP)

(72) Inventors: Hirotaka Endo, Wako (JP); Terumi Furuta, Wako (JP); Mitsumoto Kawai, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/963,852

(22) PCT Filed: Jun. 4, 2019

(86) PCT No.: PCT/JP2019/022186
§ 371 (c)(1),
(2) Date: Jul. 22, 2020

(87) PCT Pub. No.: WO2019/235481
PCT Pub. Date: Dec. 12, 2019

(65) Prior Publication Data
US 2021/0088596 A1 Mar. 25, 2021

(30) Foreign Application Priority Data
Jun. 5, 2018 (JP) .............................. JP2018-107771

(51) Int. Cl.
*G01R 31/389* (2019.01)
*G01R 31/387* (2019.01)
(Continued)

(52) U.S. Cl.
CPC ......... *G01R 31/389* (2019.01); *G01R 31/367* (2019.01); *G01R 31/387* (2019.01); *G01R 31/396* (2019.01)

(58) Field of Classification Search
None
See application file for complete search history.

(56) References Cited

U.S. PATENT DOCUMENTS

| 2002/0109506 A1 | 8/2002 | Kawakami et al. |
| 2011/0112782 A1* | 5/2011 | Majima ................. H02J 7/0029 702/63 |

(Continued)

FOREIGN PATENT DOCUMENTS

| JP | 2000-215923 | 8/2000 |
| JP | 2002-050410 | 2/2002 |

(Continued)

OTHER PUBLICATIONS

Written Opinion for International Application No. PCT/JP2019/022186 dated Aug. 13, 2019, 3 pages.

(Continued)

*Primary Examiner* — Mohammad K Islam
*Assistant Examiner* — Terence E Stifter, Jr.
(74) *Attorney, Agent, or Firm* — Amin, Turocy & Watson, LLP

(57) ABSTRACT

Provided is an internal resistance estimating method capable of estimating the internal resistance of a secondary battery, taking account of conditions when the secondary battery is being charged, without requiring progress information when the secondary battery is being used. The internal resistance estimating method for estimating the internal resistance of a secondary battery includes estimating an internal resistance Rd (Ts, Is, Va) on the basis of an internal resistance calculating formula, from an acquired internal resistance Rd (Ta, Ia, Va) of a battery, and estimating an internal resistance Rd (Ts, Is, Vs) from the estimated internal resistance Rd (Ts, Is, Va).

10 Claims, 15 Drawing Sheets

(51) Int. Cl.
G01R 31/396 (2019.01)
G01R 31/367 (2019.01)

(56) References Cited

U.S. PATENT DOCUMENTS

| 2013/0138373 A1* | 5/2013 | Lee ................ G06F 19/00 702/65 |
| 2015/0039151 A1* | 2/2015 | Yumura ............ B60L 11/1861 700/297 |
| 2016/0375790 A1* | 12/2016 | Komiyama .......... G01R 31/389 320/136 |
| 2017/0370995 A1 | 12/2017 | Huang et al. |

FOREIGN PATENT DOCUMENTS

| JP | 2013-142561 | 7/2013 |
| JP | 2015-045628 | 3/2015 |
| JP | 2017-009540 | 1/2017 |
| JP | 2017-203659 | 11/2017 |

OTHER PUBLICATIONS

International Search Report and Written Opinion for International Application No. PCT/JP2019/022186 dated Aug. 13, 2019, 9 pages.

\* cited by examiner

FIG. 15

| | INITIAL STATE: Qi (Ts, Is, VSs, VEs) =4.0 Ah | | | | | | EVALUATION TARGET: Qd (Ts, Is, VSs, VEs) =2.0 Ah | | | | | |
|---|---|---|---|---|---|---|---|---|---|---|---|---|
| A | B | C | D | E | F | | G | H | I | J | K | L |
| SOC[%] | BATTERY VOLTAGE V [V] | DISCHARGE CAPACITY DCQi [Ah] | DCQi/Qi | INTERNAL RESISTANCE Ri[mΩ] | X1 | | BATTERY VOLTAGE V [V] | DISCHARGE CAPACITY DCQd [Ah] | DCQd/Qi | INTERNAL RESISTANCE Rd[mΩ] | X2 | Y |
| 100 | 57 | 0 | 0.00 | 5 | 0.56 | | 57 | 0 | 0.00 | 10 | 0.56 | 1.00 |
| 90 | 56 | 0.4 | 0.10 | 5 | 0.56 | | 56 | 0.2 | 0.05 | 10 | 0.56 | 1.00 |
| 80 | 55 | 0.8 | 0.20 | 5 | 0.56 | | 55 (Va) | 0.4 | 0.10 | 10 | 0.56 | 1.00 |
| 70 | 53 | 1.2 | 0.30 | 6 | 0.67 | | 53 | 0.6 | 0.15 | 10 | 0.56 | 1.00 |
| 60 | 52 | 1.6 | 0.40 | 7 | 0.78 | | 52 | 0.8 | 0.20 | 10 | 0.56 | 1.00 |
| 50 | 50 (Vs) | 2.0 | 0.50 | 9 | 1.00 | | 50 (Vs) | 1.0 | 0.25 | 11 | 0.62 | 1.10 |
| 40 | 49 | 2.4 | 0.60 | 12 | 1.33 | | 49 | 1.2 | 0.30 | 12 | 0.67 | 1.20 |
| 30 | 48 | 2.8 | 0.70 | 17 | 1.89 | | 48 | 1.4 | 0.35 | 13 | 0.72 | 1.30 |
| 20 | 46 | 3.2 | 0.80 | 22 | 2.44 | | 46 | 1.6 | 0.40 | 14 | 0.78 | 1.40 |
| 10 | 45 | 3.6 | 0.90 | 27 | 3.00 | | 45 | 1.8 | 0.45 | 16 | 0.89 | 1.60 |
| 0 | 42 | 4.0 | 1.00 | 36 | 4.00 | | 42 | 2.0 | 0.50 | 18 | 1.00 | 1.80 |

INTERNAL RESISTANCE ESTIMATING METHOD, AND SECONDARY BATTERY CHARGING DEVICE

TECHNICAL FIELD

The present invention relates to an internal resistance estimating method and a secondary battery charging device, for estimating the internal resistance of a secondary battery.

BACKGROUND ART

Japanese Laid-Open Patent Publication No. 2017-009540 discloses an invention for estimating an increase amount and a decrease amount of an internal resistance of a secondary battery after a prescribed time has passed, based on temperature progression information concerning the battery temperature during use of the secondary battery, and estimating the internal resistance of the secondary battery after a prescribed time has passed from the estimated increase amount and decrease amount.

SUMMARY OF INVENTION

In the technology described in Japanese Laid-Open Patent Publication No. 2017-009540, it is necessary to acquire the temperature progression information concerning the battery temperature, and therefore it is necessary to provide a device that acquires the temperature progression information on the device side where the secondary battery is installed or on the secondary battery itself.

The present invention has been devised in order to solve this type of problem, and has the object of providing an internal resistance estimating method and a secondary battery charging device that can estimate the internal resistance of the secondary battery while considering conditions during the charging of the secondary battery, without requiring progression information during use of the secondary battery.

A first aspect of the present invention is an internal resistance estimating method for estimating an internal resistance of a secondary battery, including an internal resistance acquiring step of acquiring the internal resistance of a first secondary battery in a situation where a first condition has a first value that is different from a predetermined first standard value and in a situation where a second condition that is different from the first condition has a second value that is different from a predetermined second standard value; a first internal resistance estimating step of, based on an internal resistance calculation formula obtained by regarding the internal resistance of the first secondary battery as a function in which the first condition is a variable and performing a Taylor-expansion on the function around the first standard value, correcting the internal resistance acquired in the internal resistance acquiring step, and estimating the internal resistance of the first secondary battery in a situation of the first standard value and in a situation of the second standard value; and a second internal resistance estimating step of correcting the internal resistance estimated in the first internal resistance estimating step, and estimating the internal resistance of the first secondary battery in the situation of the first standard value and in a situation of the second standard value. In this way, it is possible to estimate the internal resistance of the secondary battery while taking into consideration the conditions during charging of the secondary battery, without requiring progress information during use of the secondary battery.

A second aspect of the present invention may be a secondary battery charging device that uses the internal resistance estimating method described above to estimate the internal resistance of the first secondary battery. In this way, it is possible to estimate the internal resistance of the secondary battery during charging of the secondary battery.

According to the internal resistance estimating method and the secondary battery charging device of the present invention, it is possible to estimate the internal resistance of the secondary battery while taking into consideration the conditions during charging of the secondary battery, without requiring progress information during use of the secondary battery.

BRIEF DESCRIPTION OF DRAWINGS

FIG. 15 is a chart used to estimate the evaluation internal resistance.

DESCRIPTION OF EMBODIMENTS

First Embodiment

[Battery Charging/Discharging Cycle]

Figure 1:
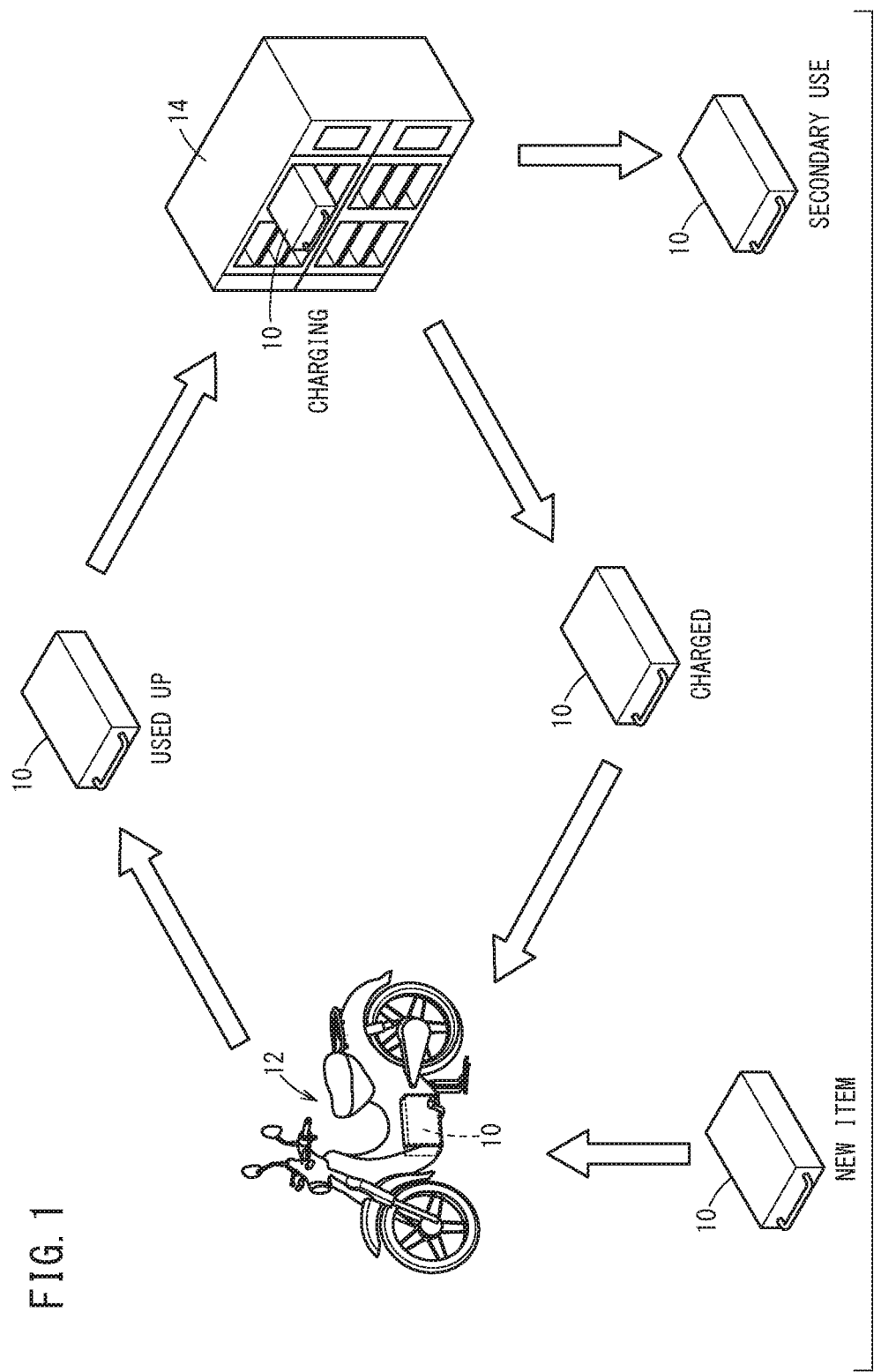
FIG. 1 is a diagram for describing a charging and discharging cycle of a battery.

FIG. 1 is a drawing for describing a charging and discharging cycle of a battery 10. The battery 10 of the present embodiment is a lithium-ion battery, for example, and corresponds to the secondary battery of the present invention. The battery 10 is mounted on an electric motorcycle 12 and is used as a drive power source of the electric motorcycle 12.

A new fully-charged battery 10 is mounted on the electric motorcycle 12, and this battery 10 supplies electric power to a drive motor of the electric motorcycle 12. A used battery 10 whose remaining power has dropped is removed from the electric motorcycle 12 and set in a battery charger 14. The battery 10 set in the battery charger 14 is charged by the battery charger 14. The charged battery 10 is again mounted on the electric motorcycle 12. The battery charger 14 is installed in various places, such as a house of the person who possesses the electric motorcycle 12, a rental station where the electric motorcycle 12 is rented, a public charging station, or the like.

The battery 10 experiences deterioration due to the charging and discharging, which causes the internal resistance of the battery 10 to change and reduces the capacity of the battery 10. In the present embodiment, the degree of deterioration of the battery 10 is evaluated from the internal resistance of the battery 10. The evaluation of the deterioration degree is performed by acquiring in advance, as an initial internal resistance Ri, the internal resistance of a battery 10 that has the same specifications as an evaluation target battery 10 (i.e., a battery which is an evaluation target) and that is in an initial state where deterioration has not occurred after being manufactured, and comparing the acquired initial internal resistance Ri to an evaluation internal resistance Rd that is the internal resistance of the evaluation target battery 10. The battery 10 in the initial state (which will also be hereinafter referred to as the initial state battery 10) does not need to be a battery 10 that has never been used since being manufactured. Usually, the usage period of the initial state battery 10 at the timing when the initial internal resistance Ri is acquired is less than the usage time of the evaluation target battery 10.

The battery 10 that has experienced a decrease in capacity due to deterioration is secondarily used for purposes other than serving as the drive power source of the electric motorcycle 12, and is used as a power storage device for home use, for example. The battery 10 is not limited to being used as a drive power source of the electric motorcycle 12, and is not particularly limited as long as it is a secondary battery. In the present embodiment, the capacity of the battery 10 refers to the amount of electricity that can be drawn out while the SOC of the battery 10 drops from 100% to 0%.

[Internal Resistance of the Battery]

Figure 2:
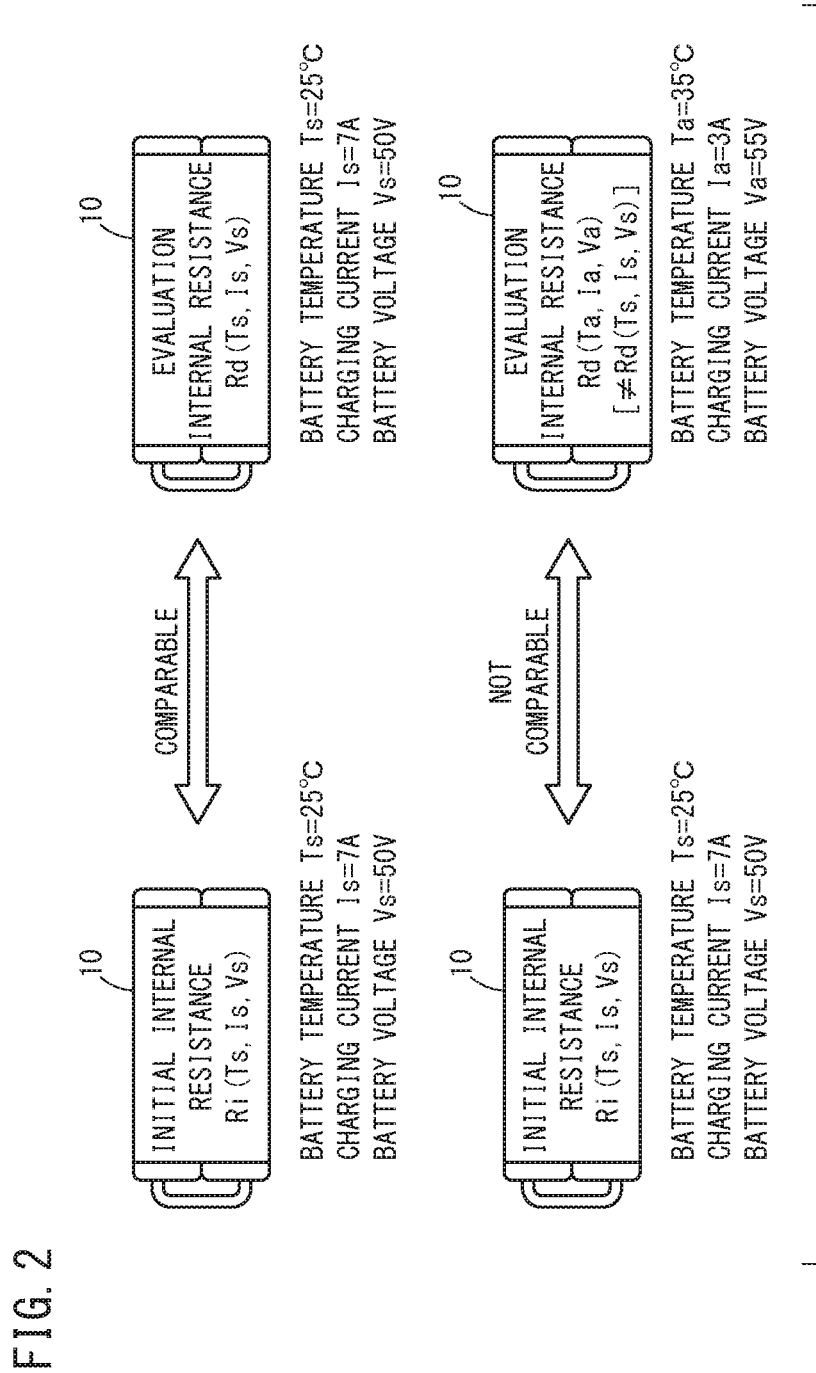
FIG. 2 is a diagram for describing a comparison between an initial internal resistance and an evaluation internal resistance.

FIG. 2 is a diagram for describing a comparison between the initial internal resistance Ri and the evaluation internal resistance Rd. When no particular distinction is being made between the initial internal resistance Ri and the evaluation internal resistance Rd in the following description, the term "internal resistance R" is used.

Even for the same battery 10, the internal resistance R changes according to the conditions at the timing when the internal resistance R is acquired. There are three main causes of such changes in the internal resistance R, which are temperature T of the battery 10 when the battery 10 is being charged (referred to below as the battery temperature), the charging current I that is the current when the battery 10 is being charged, and the battery voltage V that is the open circuit voltage of the battery 10 when the internal resistance R is acquired.

In the present embodiment, a standard value is set for each of the temperature condition, charging current condition, and battery voltage condition when the initial internal resistance Ri and the evaluation internal resistance Rd are acquired. The standard values are a battery temperature Ts of 25° C., a charging current Is of 7 A, and a battery voltage Vs of 50 V, for example. The standard values should be appropriately set within a range of normal condition values occurring when the battery 10 is being charged.

The battery temperature condition and the charging current condition correspond to a first condition of the present invention. The battery temperature Ts of 25° C. and the charging current Is of 7 A correspond to first standard values of the present invention. The battery voltage condition corresponds to a second condition of the present invention. The battery voltage Vs of 50 V corresponds to a second standard value of the present invention.

In the following description, there are cases where the internal resistance R of the battery 10 is written in a format of R (T, I, V). The inside of the parentheses indicates the value of each condition at the timing when the internal resistance R is acquired, and the initial internal resistance Ri acquired in a situation where each condition has the standard value is written as Ri (Ts, Is, Vs), for example.

The initial internal resistance Ri (Ts, Is, Vs) is acquired in advance in a situation where each condition is the standard value, through actual experimentation or the like. On the other hand, the evaluation internal resistance Rd is acquired when the battery 10 is being charged by the battery charger 14. Since battery chargers 14 are installed at various locations in cities, the condition values of the respective conditions at the timing when the evaluation internal resistance Rd is acquired are not constant, and differ from the standard values. For example, it is assumed that the evaluation internal resistance Rd (Ta, Ia, Va) is acquired in a situation where the battery temperature Ta is 35° C., the charging current Ia is 3 A, and the battery voltage Va is 55 V.

The initial internal resistance Ri (Ts, Is, Vs) and the evaluation internal resistance Rd (Ta, Ia, Va) are acquired at timings at which the condition values are different, and therefore cannot be directly compared to each other. In the present embodiment, the evaluation internal resistance Rd (Ta, Ia, Va) is corrected, the evaluation internal resistance Rd (Ts, Is, Vs) is estimated, and a comparison is made between the initial internal resistance Ri (Ts, Is, Vs) and the estimated evaluation internal resistance Rd (Ts, Is, Vs).

Figure 3:
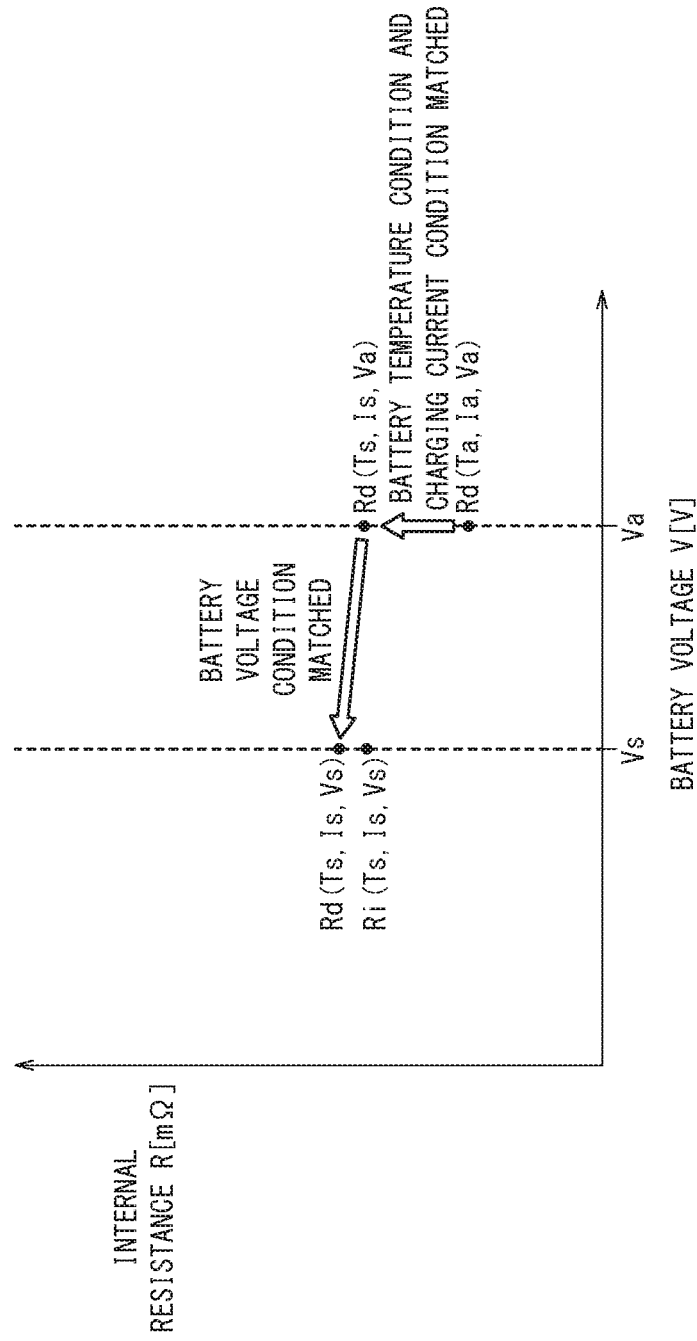
FIG. 3 is a diagram envisioned for a procedure for estimating the evaluation internal resistance.

FIG. 3 is a diagram envisioned for a procedure for estimating the evaluation internal resistance Rd (Ts, Is, Vs) from the evaluation internal resistance Rd (Ta, Ia, Va). As shown in FIG. 3, first, the evaluation internal resistance Rd (Ts, Is, Va) is estimated from the evaluation internal resistance Rd (Ta, Ia, Va), and the battery temperature condition and charging current condition are made to match the standard values. Next, the evaluation internal resistance Rd (Ts, Is, Vs) is estimated from the evaluation internal resistance Rd (Ts, Is, Va), and the battery voltage condition is made to match the standard value.

[Battery Charging Device]

Figure 4:
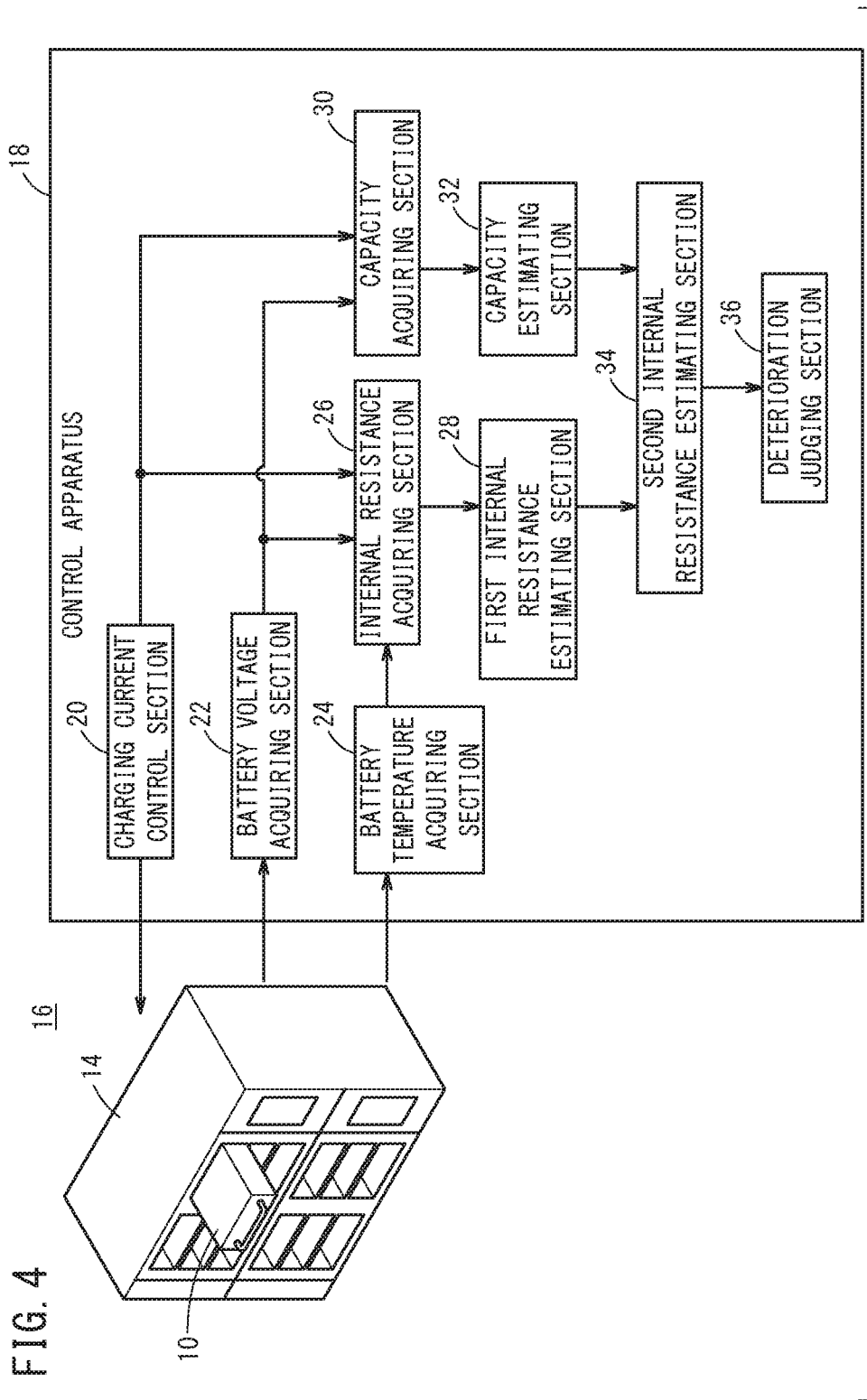
FIG. 4 is a block diagram showing a configuration of a battery charging device.

FIG. 4 is a block diagram showing a configuration of a battery charging device 16. The battery charging device 16 is formed by the battery charger 14 and a control apparatus 18 that controls the battery charger 14.

The control apparatus 18 includes a charging current control section 20, a battery voltage acquiring section 22, a battery temperature acquiring section 24, an internal resistance acquiring section 26, a first internal resistance estimating section 28, a capacity acquiring section 30, a capacity estimating section 32, a second internal resistance estimating section 34, and a deterioration judging section 36.

The charging current control section 20 controls the charging current I of the battery 10. The battery voltage acquiring section 22 acquires the battery voltage V when the battery 10 is being charged. The battery temperature acquiring section 24 acquires the battery temperature T when the battery 10 is being charged.

The internal resistance acquiring section 26 acquires the evaluation internal resistance Rd (Ta, Ia, Va). The first internal resistance estimating section 28 estimates the evaluation internal resistance Rd (Ts, Is, Va). The acquisition of the evaluation internal resistance Rd (Ta, Ia, Va) and the estimation of the evaluation internal resistance Rd (Ts, Is, Va) are described in detail further below.

The capacity acquiring section 30 acquires the capacity Qd (Ta, Ia, VSa, VEa) of the battery 10 that is the evaluation target. The capacity estimating section 32 estimates the capacity Qd (Ts, Is, VSs, VEs) of the evaluation target battery 10. The acquisition of the capacity Qd (Ta, Ia, VSa, VEa) of the evaluation target battery 10 and the estimation of the capacity Qd (Ts, Is, VSs, VEs) of the evaluation target battery 10 are described in detail further below.

The second internal resistance estimating section 34 estimates the evaluation internal resistance Rd (Ts, Is, Vs). The estimation of the evaluation internal resistance Rd (Ts, Is, Vs) is described in detail further below.

The deterioration judging section 36 compares the initial internal resistance Ri (Ts, Is, Vs) and the evaluation internal resistance Rd (Ts, Is, Vs). When the difference between the initial internal resistance Ri (Ts, Is, Vs) and the evaluation internal resistance Rd (Ts, Is, Vs) is greater than or equal to a prescribed value, it is judged that deterioration has progressed in the evaluation target battery 10, and the operator is provided with a notification or the like to bring the battery 10 into secondary use.

[Deterioration Judgment Process]

Figure 5:
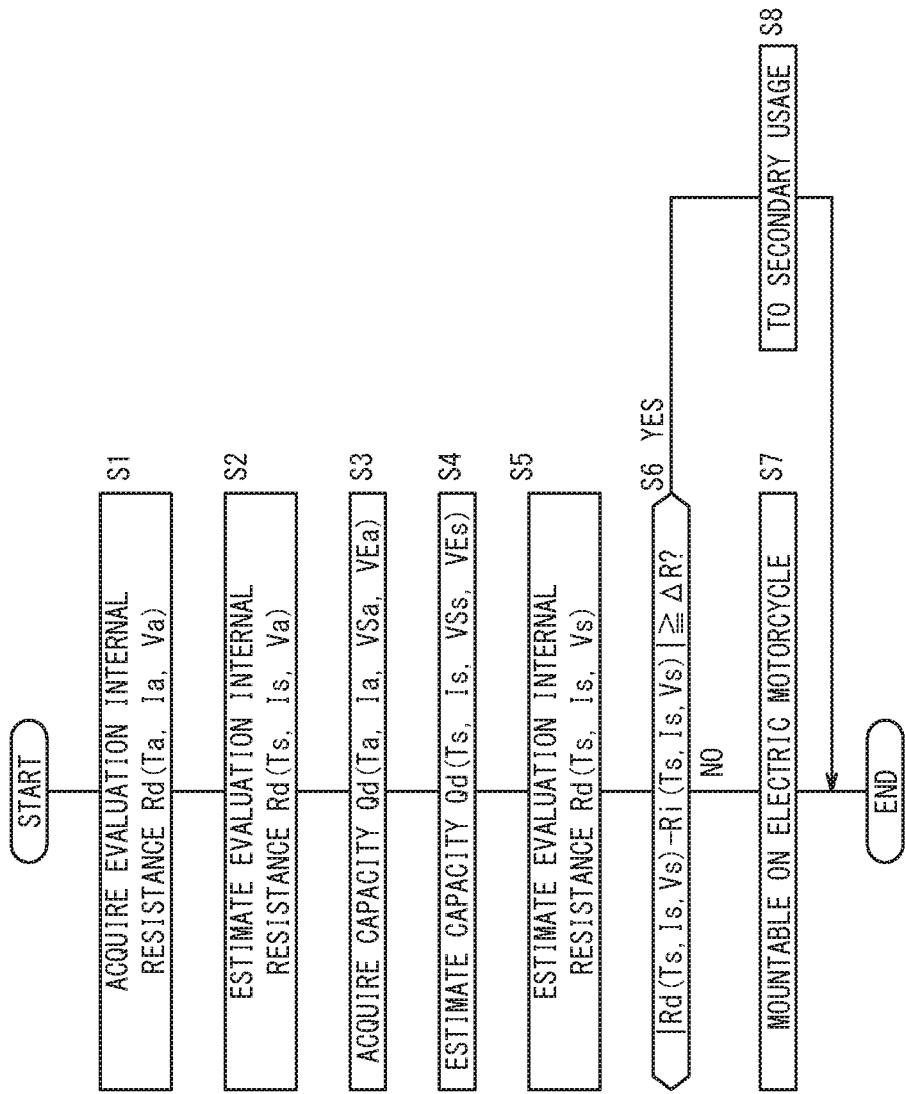
FIG. 5 is a flow chart showing the flow of a deterioration judgment process for the battery that is the evaluation target, performed by a control apparatus.

FIG. 5 is a flow chart showing the flow of the deterioration judgment process for the evaluation target battery 10, performed by the control apparatus 18.

At step S1, the internal resistance acquiring section 26 acquires the evaluation internal resistance Rd (Ta, Ia, Va). At step S2, the first internal resistance estimating section 28 estimates the evaluation internal resistance Rd (Ts, Is, Va).

At step S3, the capacity acquiring section 30 acquires the capacity Qd (Ta, Ia, VSa, VEa) of the evaluation target battery 10. At step S4, the capacity estimating section 32 estimates the capacity Qd (Ts, Is, VSs, VEs) of the battery 10 that is the evaluation target.

At step S5, the second internal resistance estimating section 34 estimates the evaluation internal resistance Rd (Ts, Is, Vs). At step S6, the deterioration judging section 36 judges whether the difference between the evaluation internal resistance Rd (Ts, Is, Vs) and the initial internal resistance Ri (Ts, Is, Vs) is greater than or equal to a prescribed value ΔR. The process moves to step S7 when the difference is less than the prescribed value ΔR, and the process moves to step S8 when the difference is greater than or equal to the prescribed value ΔR. The prescribed value ΔR is set according to the battery voltage Vs.

At step S7, the deterioration judging section 36 notifies the operator that the battery 10 can be mounted on the electric motorcycle 12. At step S8, the deterioration judging section 36 notifies the operator that it is recommended to turn the battery 10 into secondary use.

[Acquisition of Evaluation Internal Resistance Rd (Ta, Ia, Va)]

Figure 6A:
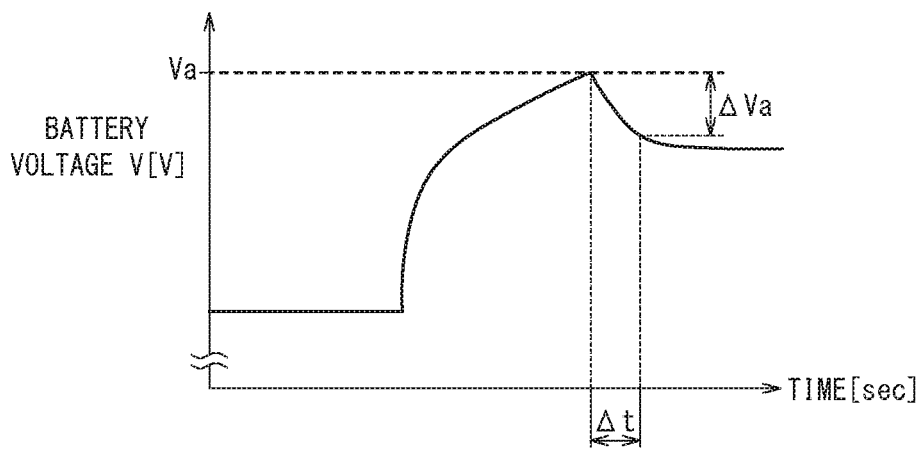
FIG. 6A is a time chart of a battery voltage during charging of the battery.
Figure 6B:
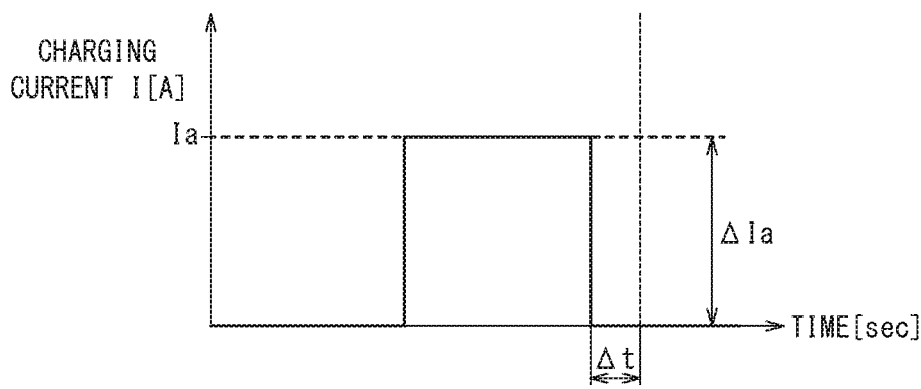
FIG. 6B is a time chart of a charging current during charging of the battery.
Figure 6C:
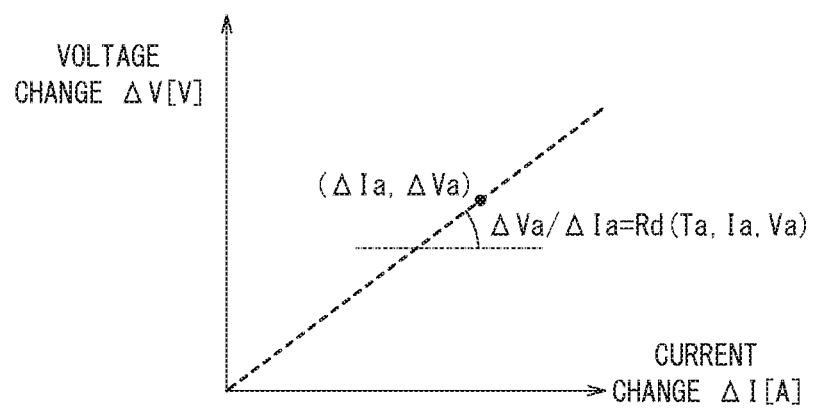
FIG. 6C is a graph showing the relationship between the voltage change of the battery voltage and the current change of the charging current after charging ends.

The following describes a method of acquiring the evaluation internal resistance Rd (Ta, Ia, Va). FIG. 6A is a time chart of the battery voltage V during charging of the battery 10. FIG. 6B is a time chart of the charging current I during the charging of the battery 10. FIG. 6C is a graph showing the relationship between a voltage change ΔV of the battery voltage V and a current change ΔI of the charging current I after charging has ended.

The charging current I during charging of the battery 10 is Ia, and the battery voltage V when the charging ends is Va. The voltage change ΔV after a prescribed time Δt (e.g., 10 seconds) has passed from the end of the charging is ΔVa, and the current change ΔI at this time is ΔIa. Furthermore, the battery temperature T when the charging ends is Ta. At this time, the evaluation internal resistance Rd can be obtained using Equation (1) shown below.

$$Rd(Ta, Ia, Va) = \frac{\Delta Va}{\Delta Ia} \qquad (1)$$

In the above description, the evaluation internal resistance Rd (Ta, Ia, Va) is acquired based on the battery voltage V when the charging of the battery 10 ends, but the evaluation internal resistance Rd (Ta, Ia, Va) may instead be acquired based on the battery voltage V when charging of the battery 10 starts.

Figure 7A:
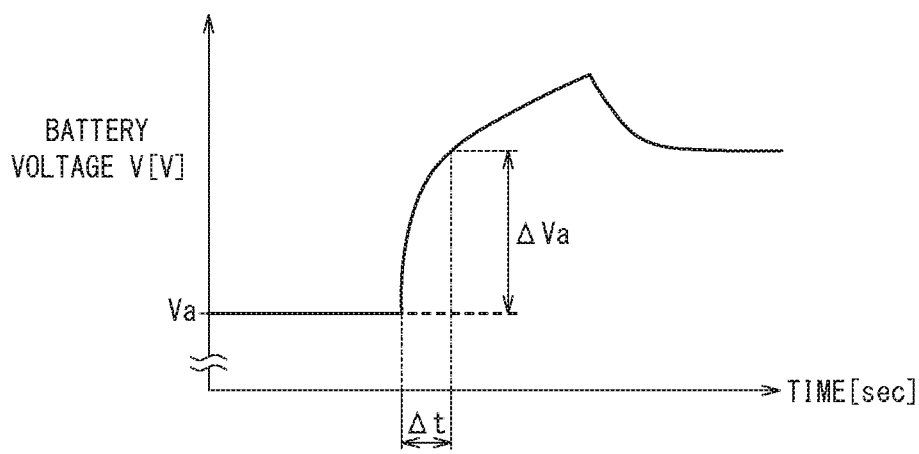
FIG. 7A is a time chart of a battery voltage during charging of the battery.
Figure 7B:
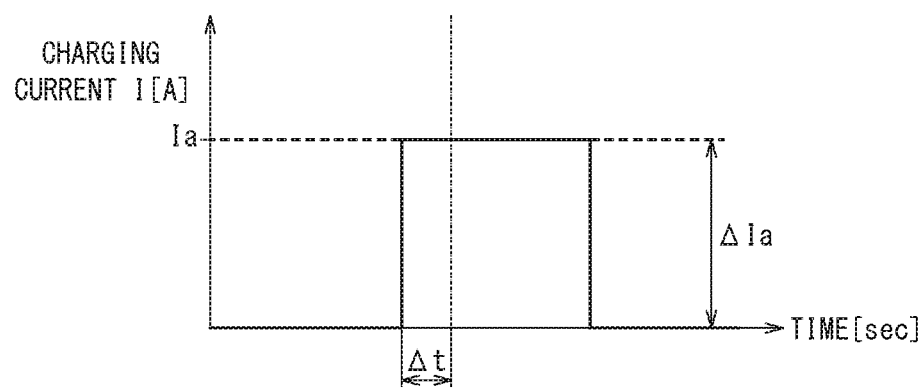
FIG. 7B is a time chart of a charging current during charging of the battery.
Figure 7C:
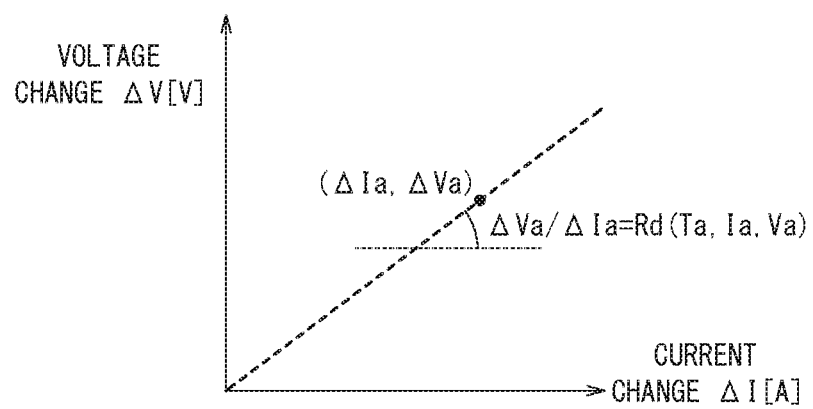
FIG. 7C is a graph showing the relationship between the voltage change of the battery voltage and the current change of the charging current after charging ends.

FIG. 7A is a time chart of the battery voltage V during charging of the battery 10. FIG. 7B is a time chart of the charging current I during charging of the battery 10. FIG. 7C is a graph showing the relationship between the voltage change ΔV of the battery voltage V and the current change ΔI of the charging current I after charging has ended.

The charging current I during charging of the battery 10 is Ia, and the battery voltage V when the charging starts is Va. The voltage change ΔV after a prescribed time Δt (e.g., 10 seconds) has passed from the start of the charging is ΔVa, and the current change ΔI at this time is ΔIa. Furthermore, the battery temperature T when the charging of the battery 10 starts is Ta. At this time, the evaluation internal resistance Rd can be obtained using Equation (1), in the same manner as described above.

The above describes a method for acquiring the evaluation internal resistance Rd, and the acquisition of the initial internal resistance Ri can be performed in the same manner.

For the initial internal resistance Ri, the initial internal resistance Ri (Ts, Is, Vs) can be acquired in advance in a situation where each condition is the standard value. Furthermore, the initial internal resistance Ri can be acquired in advance in a situation where each condition has been changed.

[Estimation of the Evaluation Internal Resistance Rd (Ts, Is, Va)]

The evaluation internal resistance Rd (Ta, Ia, Va) is corrected and the evaluation internal resistance Rd (Ts, Is, Va) is estimated, based on Equation (2) shown below.

$$Rd(Ts, Is, Va) = Rd(Ta, Ia, Va) - \frac{\partial Rd(T)}{\partial T}\bigg|_{T=Ts}(Ta - Ts) - \frac{\partial Rd(I)}{\partial I}\bigg|_{I=Is}(Ia - Is) \quad (2)$$

Equation (2) is obtained as follows: the evaluation internal resistance Rd is regarded as a function in which the battery temperature condition and the charging current condition are variables, and the function is Taylor-expanded around the battery temperature Ts and the charging current Is, which are the standard values of the battery temperature condition and the charging current condition, whereby Equation (3) below is obtained. Then, Equation (2) is obtained from Equation (3).

$$Rd(T, I, Va) = \quad (3)$$
$$Rd(Ts, Is, Va) + \sum_{n=1}^{\infty}\frac{1}{n!}\left\{\frac{\partial}{\partial T}(T - Ts) + \frac{\partial}{\partial I}(I - Is)\right\}^n Rd(T, I, Va)\bigg|_{T=Ts, I=Is}$$

Equation (4) below is obtained by keeping the portion of the above Equation (3) up to the first-order partial differential term.

$$Rd(T, I, Va) = Rd(Ts, Is, Va) + \frac{\partial Rd(T)}{\partial T}\bigg|_{T=Ts}(T - Ts) + \frac{\partial Rd(I)}{\partial I}\bigg|_{I=Is}(I - Is) \quad (4)$$

When T=Ta and I=Ia are substituted into an equation obtained by adapting Equation (4) for the evaluation internal resistance Rd (Ts, Is, Va), Equation (2) shown above can be obtained. In Equation (2), if the battery temperature correction coefficient that is a coefficient of the battery temperature difference (Ta−Ts) and the charging current correction coefficient that is a coefficient of the charging current difference (Ia−Is) are known, it is possible to estimate the evaluation internal resistance Rd (Ts, Is, Va) from the evaluation internal resistance Rd (Ta, Ia, Va) using Equation (2). Here, the battery temperature dependency of the initial internal resistance Ri and the battery temperature dependency of the evaluation internal resistance Rd are substantially equal, and therefore Equation (5) shown below is established.

$$\frac{\partial Rd(T)}{\partial T}\bigg|_{T=Ts} = \frac{\partial Ri(T)}{\partial T}\bigg|_{T=Ts} \quad (5)$$

Furthermore, the charging current dependency of the initial internal resistance Ri and the charging current dependency of the evaluation internal resistance Rd are substantially equal, and therefore Equation (6) shown below is established.

$$\frac{\partial Rd(I)}{\partial I}\bigg|_{I=Is} = \frac{\partial Ri(I)}{\partial I}\bigg|_{I=Is} \quad (6)$$

In the present embodiment, the battery temperature correction coefficient and the charging current correction coefficient are obtained in advance. The method for obtaining the battery temperature correction coefficient and the charging current correction coefficient is described below. The initial internal resistance Ri can be obtained in the same manner as the evaluation internal resistance Rd, as shown in Equation (7) below.

$$Ri(T, I, Va) = Ri(Ts, Is, Va) + \frac{\partial Ri(T)}{\partial T}\bigg|_{T=Ts}(T - Ts) + \frac{\partial Ri(I)}{\partial I}\bigg|_{I=Is}(I - Is) \quad (7)$$

When I=Is is substituted into Equation (7) above, Equation (8) shown below can be obtained.

$$Ri(T, Is, Va) = Ri(Ts, Is, Va) + \frac{\partial Ri(T)}{\partial T}\bigg|_{T=Ts}(T - Ts) \quad (8)$$

When T=Ts is substituted into Equation (7) above, Equation (9) shown below can be obtained.

$$Ri(Ts, I, Va) = Ri(Ts, Is, Va) + \frac{\partial Ri(I)}{\partial I}\bigg|_{I=Is}(I - Ts) \quad (9)$$

Figure 8A:
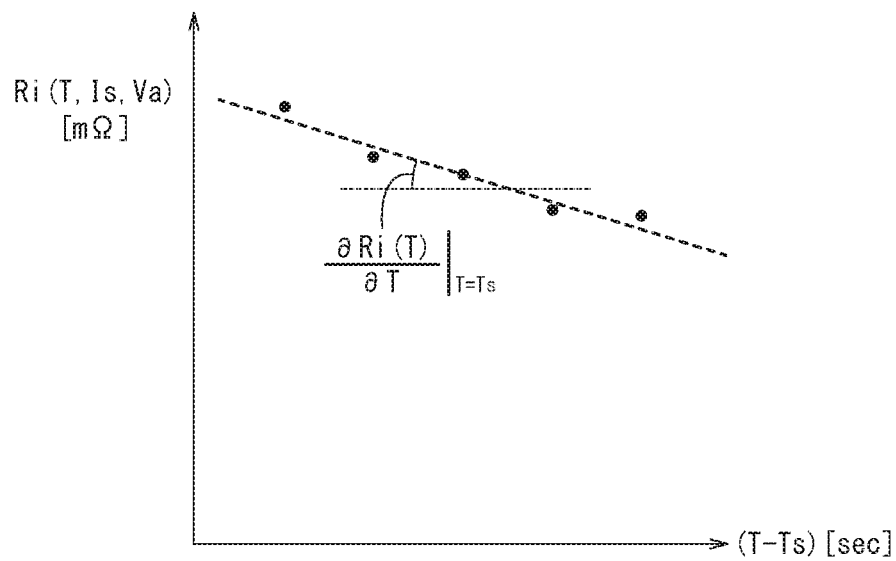
FIG. 8A is a graph showing the relationship between the battery temperature difference and the initial internal resistance.
Figure 8B:
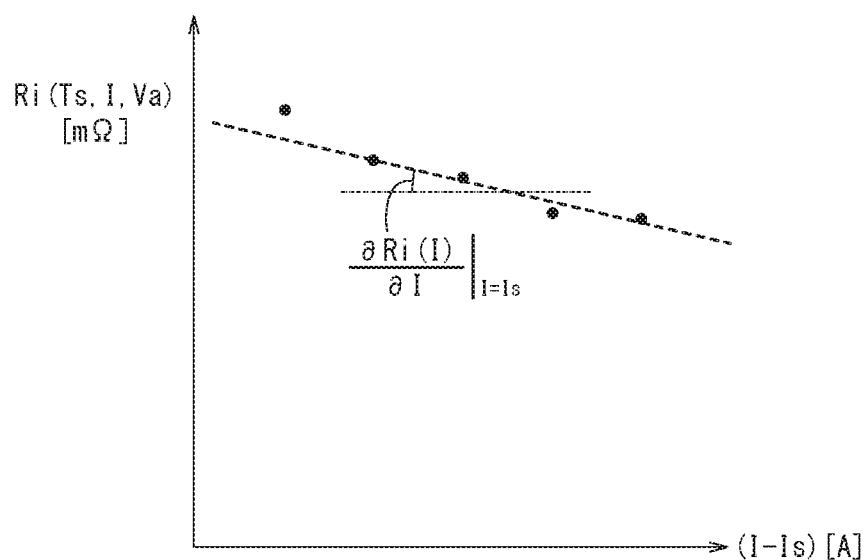
FIG. 8B is a graph showing the relationship between the charging current difference and the initial internal resistance.

FIG. 8A is a graph showing the relationship between the battery temperature difference (T−Ts) and the initial internal resistance Ri (T, Is, Va). FIG. 8B is a graph showing the relationship between the charging current difference (I−Is) and the initial internal resistance Ri (Ts, I, Va).

When the charging current condition is fixed at the charging current Is, the battery voltage condition is fixed at the battery voltage Va, and the battery temperature condition is changed, data concerning the initial internal resistance Ri (T, Is, Va) relative to the battery temperature difference (T−Ts) is acquired, as shown in FIG. 8A. The acquired initial internal resistance Ri (T, Is, Va) is approximated by a linear function in which the battery temperature difference (T−Ts) is a variable. The slope of this linear function corresponds to the battery temperature correction coefficient.

When the battery temperature condition is fixed at the battery temperature Ts, the battery voltage condition is fixed at the battery voltage Va, and the charging current condition is changed, data concerning the relationship of the initial internal resistance Ri relative to the charging current difference (I−Is) is acquired, as shown in FIG. 8B. The data of the charging current difference (I−Is) and the initial internal resistance Ri (Ts, I, Va) shown in FIG. 8B is acquired. The acquired initial internal resistance Ri (Ts, I, Va) is approximated by a linear function in which the battery charging current difference (I−Is) is a variable. The slope of this linear function corresponds to the battery charging current correction coefficient.

An equation obtained by substituting the battery temperature correction coefficient and charging current correction coefficient into Equation (2) is the internal resistance calculation formula, and it is possible to correct the evaluation internal resistance Rd (Ta, Ia, Va) and estimate the evaluation internal resistance Rd (Ts, Is, Va) using this internal resistance calculation formula.

[Battery Voltage Dependency]

Figure 9:
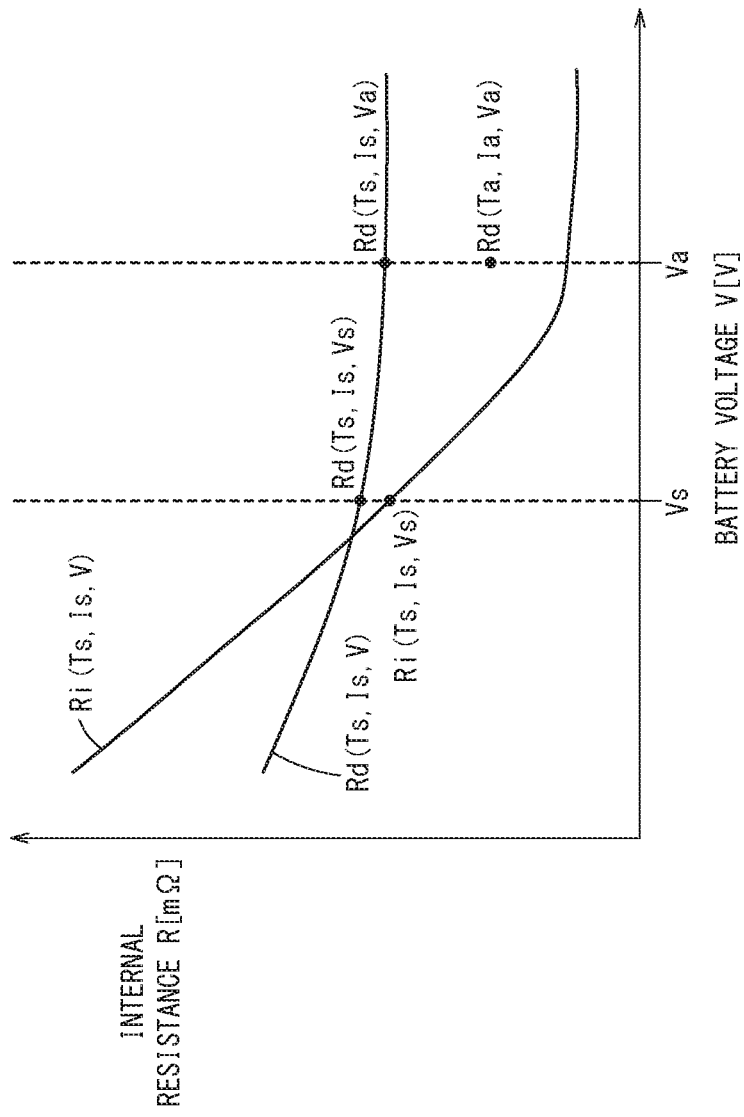
FIG. 9 is a graph showing the relationship of the initial internal resistance and evaluation internal resistance relative to the battery voltage.

FIG. 9 is a graph showing the relationship of the initial internal resistance Ri and the evaluation internal resistance Rd relative to the battery voltage V when the battery temperature is Ts and the charging current is Is. As shown in FIG. 9, the battery voltage dependency of the initial internal resistance Ri differs from the battery voltage dependency of the evaluation internal resistance Rd. The following describes this difference in the battery voltage dependency.

Figure 10A:
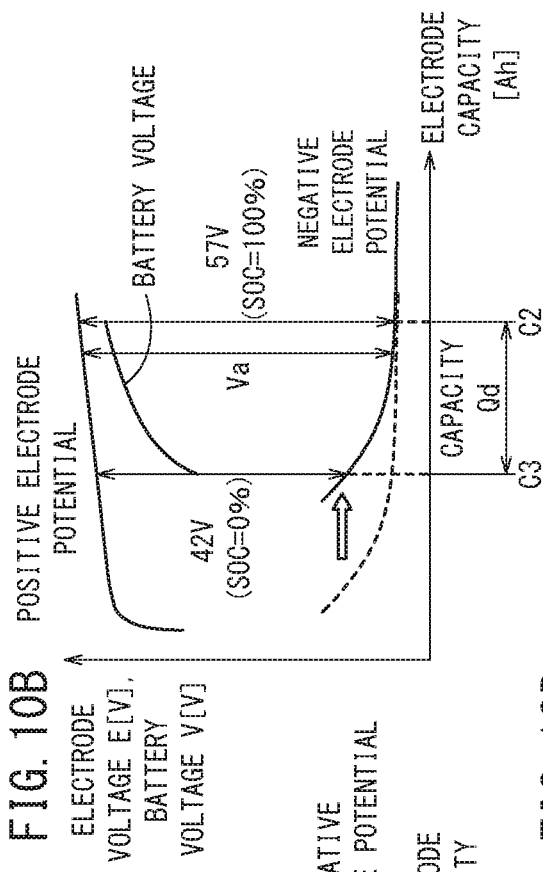
FIG. 10A schematically shows the positive open circuit potential curve and the negative open circuit potential curve of the battery in the initial state, FIG. 10B schematically shows the positive open circuit potential curve and the negative open circuit potential curve of the battery that is the evaluation target.
Figure 10B:
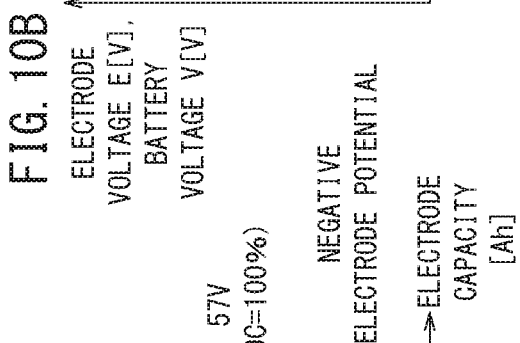
FIG. 10C is a graph showing a curve of the ratio of the initial internal resistance Ri (Ts, Is, V) to the initial internal resistance Ri (Ts, Is, Va)
FIG. 10D is a graph showing a curve of the ratio of the evaluation internal resistance Rd (Ts, Is, V) to the evaluation internal resistance Rd (Ts, Is, Va)

FIG. 10A schematically shows the positive open circuit potential curve and the negative open circuit potential curve of the battery 10 in the initial state. FIG. 10B schematically shows the positive open circuit potential curve and the negative open circuit potential curve of the battery 10 that is the evaluation target.

As shown in FIG. 10A, the difference between the electrode capacity when the battery voltage V is 57 V, corresponding to an SOC of 100%, and the electrode capacity when the battery voltage V is 42 V, corresponding to an SOC of 0%, is the capacity Qi of the battery 10.

The battery 10 of the present embodiment is a lithium ion battery, and experiences irreversible capacity loss due to charging and discharging. The reason is a decrease in the capacity Q of the battery 10 due to lithium ions, which are charge carriers, being deposited from the surface of the negative electrode, an increase in the internal resistance R due to formation of a film on the surface of the negative electrode caused by decomposition of an electrolytic solution or a film forming material that is transferred to the electrolytic solution, and the like.

As shown in FIG. 10B, the irreversible capacity loss of the battery 10 increases, and accordingly the positive open circuit potential curve moves to the high-capacity side. Due to this, as shown in FIGS. 10A and 10B, the capacity Qd of the battery 10 that is the evaluation target decreases relative to the capacity Qi of the battery 10 in the initial state. There are also cases where the positive open circuit potential curve moves due to usage of the battery 10.

Figure 10C:
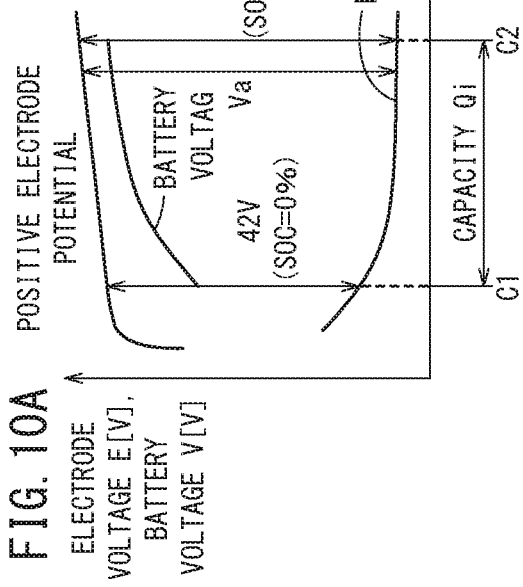
Figure 10D:
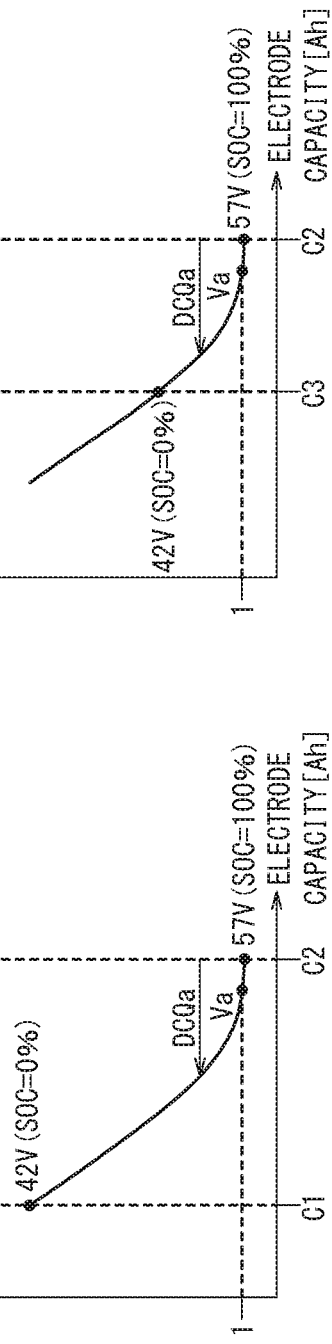

FIG. 10C is a graph showing a curve of the ratio of the initial internal resistance Ri (Ts, Is, V) to the initial internal resistance Ri (Ts, Is, Va), which is also shown below as the ratio Ri (Ts, Is, V)/Ri (Ts, Is, Va). FIG. 10D is a graph showing a curve of the ratio of the evaluation internal resistance Rd (Ts, Is, V) to the evaluation internal resistance Rd (Ts, Is, Va), which is also shown below as the ratio Rd (Ts, Is, V)/Rd (Ts, Is, Va).

Assuming that the resistance change is dominant in the Li composition ratio of the positive electrode, the dependency of the ratio Ri (Ts, Is, V)/Ri (Ts, Is, Va) on the electrode capacity and the dependency of the ratio Rd(Ts, Is, V)/Rd (Ts, Is, Va) on the electrode capacity are the same, as shown in FIGS. 10C and 10D. However, in the battery 10 that is the evaluation target, the range of the capacity that can be used is reduced compared to that of the battery 10 in the initial state, and therefore the range of the change of the ratio Rd(Ts, Is, V)/Rd(Ts, Is, Va) becomes smaller than the range of the change of the ratio Ri (Ts, Is, V)/Ri (Ts, Is, Va).

Figure 11:
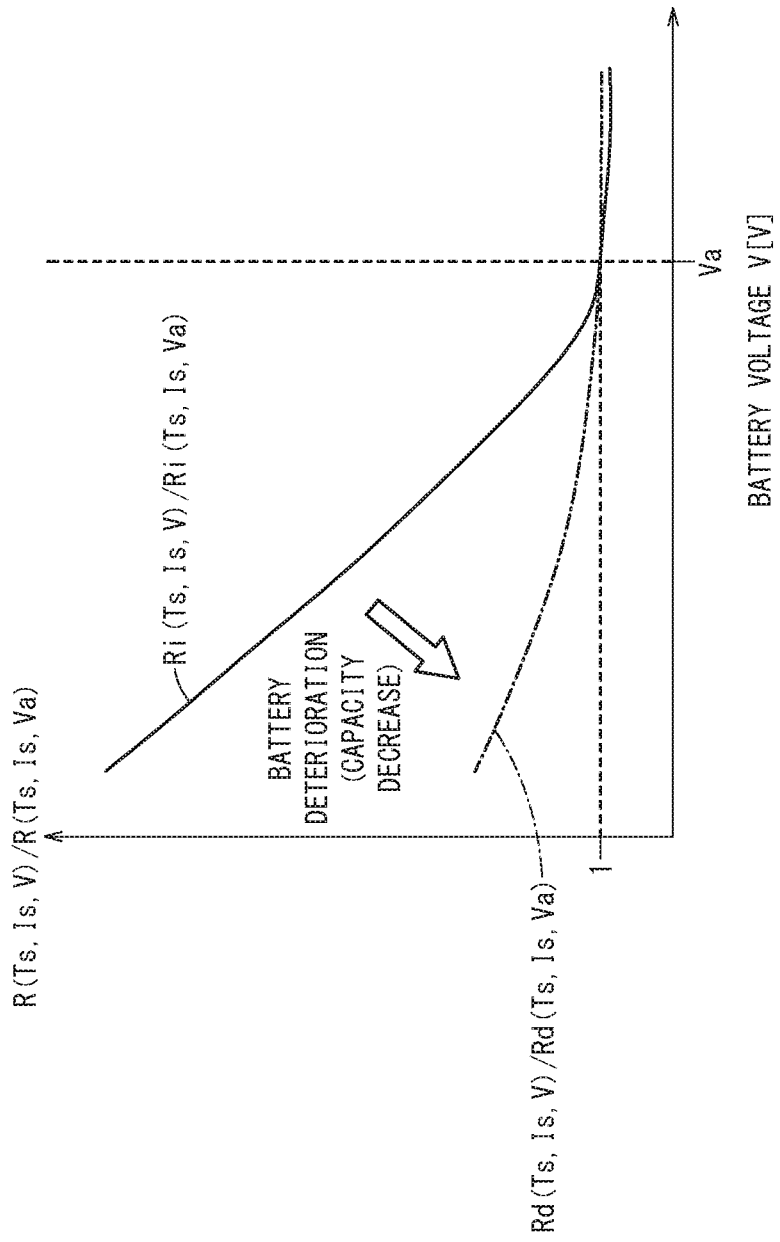
FIG. 11 is a graph showing the relationship between the battery voltage and the ratio of the initial internal resistance and the relationship between the battery voltage and the ratio of the evaluation internal resistance.

FIG. 11 is a graph showing the relationship between the battery voltage V and the ratio Ri (Ts, Is, V)/Ri(Ts, Is, Va) and the relationship between the battery voltage V and the ratio Rd(Ts, Is, V)/Rd(Ts, Is, Va). FIG. 11 is obtained by rewriting FIGS. 10C and 10D as a graph in which the horizontal axis represents the battery voltage V. As shown in FIG. 11, the change in the ratio Rd (Ts, Is, V)/Rd (Ts, Is, Va) per unit of battery voltage is more gradual than the change of the ratio Ri (Ts, Is, V)/Ri (Ts, Is, Va) per unit of battery voltage. In other words, the change of the battery voltage dependency of the evaluation internal resistance Rd that accompanies the deterioration can be thought of as being correlated with the change of the capacity Qd of the battery 10.

In the following description, the difference between the capacity Q and the remaining power of the battery 10 is referred to as the discharge capacity DCQ. Returning to FIGS. 10C and 10D, when the discharge capacity DCQ of the battery 10 in the initial state and the discharge capacity DCQ of the battery 10 that is the evaluation target are the same discharge capacity DCQa, the ratio Ri (Ts, Is, V)/Ri (Ts, Is, Va) and the ratio Rd (Ts, Is, V)/Rd (Ts, Is, Va) exhibit the same value.

In the present embodiment, the evaluation internal resistance Rd (Ts, Is, Vs) is estimated from the evaluation internal resistance Rd(Ts, Is, Va), based on the fact that the ratio Ri (Ts, Is, V)/Ri (Ts, Is, Va) and the ratio Rd (Ts, Is, V)/Rd (Ts, Is, Va) have the same value when the discharge capacities DCQ are the same.

[Battery Capacity]

When the description below does not particularly distinguish between the capacity Qi of the battery 10 in the initial state and the capacity Qd of the battery 10 that is the evaluation target, the term "capacity Q" is used. Even for the same battery 10, the capacity Q changes according to the conditions at the timing when the capacity Q is acquired. There are four main causes for the change of the capacity Q, which are the battery temperature T that is the temperature around the battery 10 when the battery 10 is being charged, the charging current I that is the current when the battery 10 is being charged, the charging start voltage VS that is the open circuit voltage of the battery 10 when the charging of the battery 10 starts, and the charging end voltage VE that is the open circuit voltage of the battery 10 when the charging of the battery 10 ends.

In the present embodiment, a standard value is set for each of the battery temperature condition, charging current condition, charging start voltage condition, and charging end voltage condition when the capacity Qi and the capacity Qd are acquired. The standard values are a battery temperature Ts of 25° C., a charging current Is of 7 A, a charging start voltage VSs of 42 V, and a charging end voltage VEs of 57 V, for example. The standard values should be suitably set within a range of normal condition values occurring when the battery 10 is being charged.

The battery temperature condition, the charging current condition, the charging start voltage condition, and the charging end voltage condition correspond to a third condition of the present invention. The battery temperature Ts of 25° C., the charging current Is of 7 A, the charging start voltage VSs of 42 V, and the charging end voltage VEs of 57 V correspond to third standard values of the present invention.

In the following description, there are cases where the capacity Q of the battery 10 is written in a format of Q (T, I, VS, VE). The inside of the parentheses indicates the value of each condition at the timing when the capacity Q is acquired, and the capacity Qi of the battery 10 in the initial state acquired in a situation where each condition has the standard value is written as Qi (Ts, Is, VSs, VEs), for example.

The capacity Qi (Ts, Is, VSs, VEs) of the battery 10 in the initial state is acquired in advance, through experimentation or the like. On the other hand, the capacity Qd of the evaluation target battery 10 is acquired when the battery 10 is being charged by the battery charger 14. Since battery chargers 14 are installed at various locations in cities, the condition values of the respective conditions at the timing when the capacity Qd is acquired are not constant, and differ from the standard values. As an example, it is assumed that the capacity Qd (Ta, Ia, VSa, VEa) is acquired in a situation where the battery temperature Ta is 35° C., the charging current Ia is 3 A, the charging start voltage VSa is 50 V, and the charging end voltage VEa is 55 V. In the present embodiment, the capacity Qd (Ta, Ia, VSa, VEa) is corrected and the capacity Qd (Ts, Is, VSs, and VEs) is estimated.

[Acquisition of the Capacity Qd (Ta, Ia, VSa, VEa)]

Figure 12A:
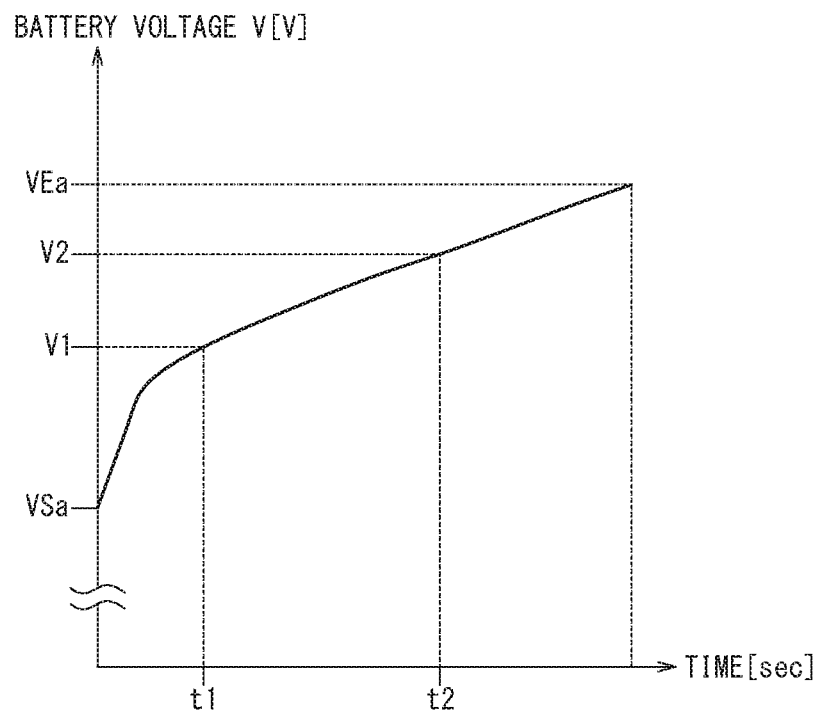
FIG. 12A is a time chart of the battery voltage during charging of the battery.
Figure 12B:
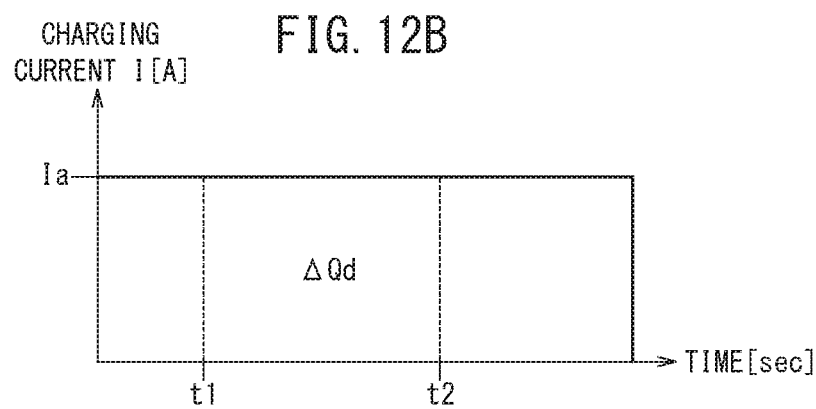
FIG. 12B is a time chart of the charging current during charging of the battery.
Figure 13:
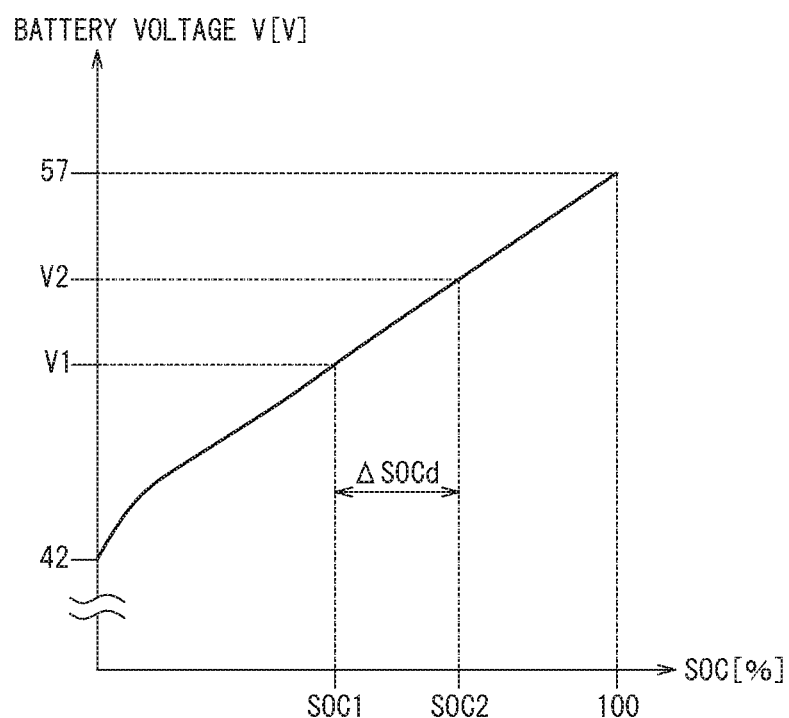
FIG. 13 is an SOC-battery voltage map showing a relationship between the SOC and the battery voltage.

The following describes the method for acquiring the capacity Qd (Ta, Ia, VSa, VEa) of the battery 10 that is the evaluation target. FIG. 12A is a time chart of the battery voltage V during charging of the battery 10. FIG. 12B is a time chart of the charging current I during charging of the battery 10. FIG. 13 is an SOC-battery voltage map showing a relationship between the SOC and the battery voltage V.

The charging current I of the battery 10 is Ia, the charging start voltage VS is VSa, and the charging end voltage VE is VEa. Furthermore, the battery temperature T is Ta. The battery temperature T may be an average value of the battery temperature from when the charging of the battery 10 starts to when the charging ends, the battery temperature when the charging of the battery 10 starts, or the battery temperature when the charging of the battery 10 ends. At this time, the capacity Qd (Ta, Ia, VSa, VEa) of the battery 10 can be obtained by Equation (10) shown below.

$$Qd(Ta, Ia, VSa, VEa) = \frac{\Delta Qd}{\Delta SOCd} \quad (10)$$

The ΔQd in Equation (10) above is the time integral of the charging current Ia during the charging of the evaluation target battery 10 from the battery voltage V1 to the battery voltage V2, and can be obtained from Equation (11) below.

$$\Delta Qd = \int_{t1}^{t2} Ia \, dt \quad (11)$$

Furthermore, the ΔSOCd in Equation (10) above is obtained from Equation (12) below, using SOC1 corresponding to the battery voltage V1 and SOC2 corresponding to the battery voltage V2, obtained from the SOC-battery voltage map of FIG. 13.

$$\Delta SOCd = SOC2 - SOC1 \quad (12)$$

The above describes the method for acquiring the capacity Qd of the evaluation target battery 10, and the acquisition of the capacity Qi of the battery 10 in the initial state can be performed in the same manner. For the capacity Qi of the battery 10 in the initial state, the capacity Qi (Ts, Is, VSs, VEs) is acquired in advance in a situation where each condition is the standard value.

[Estimation of the Capacity Qd (Ts, Is, VSs, VEs)]

The capacity Qd (Ta, Ia, VSa, VEa) of the battery 10 that is the evaluation target is corrected and the capacity Qd (Ts, Is, VSs, VEs) is estimated based on Equation (13) shown below.

$$Qd(Ts, Is, VSs, VEs) = Qd(Ta, Ia, VSa, VEa) - \frac{\partial Qd(T)}{\partial T}\bigg|_{T=Ts} \quad (13)$$

$$(Ta - Ts) - \frac{\partial Qd(I)}{\partial I}\bigg|_{I=Is}(Ia - Is) - \frac{\partial Qd(VS)}{\partial Vs}\bigg|_{VS=VSs}$$

$$(VSa - VSs) - \frac{\partial Qd(VE)}{\partial VE}\bigg|_{VE=VEs}(VEa - VEs)$$

Equation (13) above is obtained as follows: the capacity Qd of the evaluation target battery 10 is regarded as a function in which the battery temperature condition, the charging current condition, the charging start voltage condition, and the charging end voltage condition are variables, and the function is Taylor-expanded around the battery temperature Ts, the charging current Is, the charging start voltage VSs, and the charging end voltage VEs that are the standard values of the battery temperature condition, the charging current condition, the charging start voltage condition, and the charging end voltage condition, whereby Equation (14) below is obtained. Then, Equation (13) is obtained from Equation (14).

$$Qd(T, I, VS, VE) = Qd(Ts, Is, VSs, VEs) + \sum_{n=1}^{\infty} \frac{1}{n!} \quad (14)$$

$$\left\{\frac{\partial}{\partial T}(T - Ts) + \frac{\partial}{\partial I}(I - Is) + \frac{\partial}{\partial VS}(VS - VSs) + \frac{\partial}{\partial VE}(VE - VEs)\right\}^n$$

$$Qd(T, I, VS, VE)\bigg|_{T=Ts, I=Is, VS=VSs, VE=VEs}$$

Equation (15) below is obtained by keeping the portion of the above Equation (14) up to the first-order partial differential term.

$$Qd(T, I, VS, VE) = Qd(Ts, Is, VSs, VEs) + \frac{\partial Qd(T)}{\partial T}\bigg|_{T=Ts} \quad (15)$$

$$(T - Ts) + \frac{\partial Qd(I)}{\partial I}\bigg|_{I=Is}(I - Is) + \frac{\partial Qd(VS)}{\partial Vs}\bigg|_{VS=VSs}$$

$$(VS - VSs) - \frac{\partial Qd(VE)}{\partial VE}\bigg|_{VE=VEs}(VE - VEs)$$

When T=Ta, I=Ia, VS=VSa, and VE=VEa are substituted into an equation obtained by adapting Equation (15) for the capacity Qd (Ts, Is, VSs, VEs), Equation (13) shown above can be obtained. In Equation (13), if the battery temperature correction coefficient that is a coefficient of the battery temperature difference (Ta−Ts), the charging current correction coefficient that is a coefficient of the charging current difference (Ia−Is), the charging start voltage correction coefficient that is a coefficient of the charging start voltage difference (VSa−VSs), and the charging end voltage correction coefficient that is a coefficient of the charging end voltage difference (VEa−VEs) are known, it is possible to estimate the capacity Qd (Ts, Is, VSs, VEs) from the capacity Qd (Ta, Ia, VSa, VEa) using Equation (15). Here, the battery temperature dependency of the capacity Qi of the battery 10 in the initial state and the battery temperature dependency of the capacity Qd of the battery 10 that is the evaluation target are substantially equal, and therefore Equation (16) shown below is established.

$$\left.\frac{\partial Qd(T)}{\partial T}\right|_{T=TS} = \left.\frac{\partial Qt(T)}{\partial T}\right|_{T=Ts} \quad (16)$$

Furthermore, since the charging current dependency of the capacity Qi of the battery 10 in the initial state and the charging current dependency of the capacity Qd of the battery 10 that is the evaluation target are substantially equal, Equation (17) shown below is established.

$$\left.\frac{\partial Qd(I)}{\partial I}\right|_{I=IS} = \left.\frac{\partial Qi(T)}{\partial I}\right|_{I=Is} \quad (17)$$

Since the charging start voltage dependency of the capacity Qi of the battery 10 in the initial state and the charging start voltage dependency of the capacity Qd of the battery 10 that is the evaluation target are substantially equal, Equation (18) shown below is established.

$$\left.\frac{\partial Qd(VS)}{\partial VS}\right|_{VS=VSs} = \left.\frac{\partial Qi(VS)}{\partial VS}\right|_{VS=VSs} \quad (18)$$

Since the charging end voltage dependency of the capacity Qi of the battery 10 in the initial state and the charging end voltage dependency of the capacity Qd of the battery 10 that is the evaluation target are substantially equal, Equation (19) shown below is established.

$$\left.\frac{\partial Qd(VE)}{\partial VE}\right|_{VE=VEs} = \left.\frac{\partial Qi(VE)}{\partial VE}\right|_{VE=VEs} \quad (19)$$

In the present embodiment, the battery temperature correction coefficient, the charging current correction coefficient, the charging start voltage correction coefficient, and the charging end voltage correction coefficient are obtained in advance. The following describes the method for obtaining the battery temperature correction coefficient, the charging current correction coefficient, the charging start voltage correction coefficient, and the charging end voltage correction coefficient. The capacity Qi of the battery 10 in the initial state is obtained using Equation (20) below, in the same manner as the capacity Qd of the battery 10 that is the evaluation target.

$$Qd(T, I, VS, VE) = Qi(Ts, Is, VSs, VEs) + \left.\frac{\partial Qi(T)}{\partial T}\right|_{T=Ts} \quad (20)$$
$$(T-Ts) + \left.\frac{\partial Qi(I)}{\partial I}\right|_{I=Is}(I-Is) + \left.\frac{\partial Qi(VS)}{\partial Vs}\right|_{VS=VSs}$$
$$(VS-VSs) + \left.\frac{\partial Qi(VE)}{\partial VE}\right|_{VE=VEs}(VE-VEs)$$

When I=Is, VS=VSs, and VE=VEs are substituted into Equation (20) above, Equation (21) shown below is obtained.

$$Qi(T, Is, VSs, VEs) = Qi(Ts, Is, VSs, VEs) + \left.\frac{\partial Qi(T)}{\partial T}\right|_{T=Ts}(T-Ts) \quad (21)$$

When T=Ts, VS=VSs, and VE=VEs are substituted into Equation (20) above, Equation (22) shown below is obtained.

$$Qi(Ts, I, VSs, VEs) = Qi(Ts, Is, VSs, VEs) + \left.\frac{\partial Qi(I)}{\partial I}\right|_{I=Is}(I-Is) \quad (22)$$

When T=Ts, I=Is, and VE=VEs are substituted into Equation (20) above, Equation (23) shown below is obtained.

$$Qi(Ts, Is, VS, VEs) = \quad (23)$$
$$Qi(Ts, Is, VSs, VEs) + \left.\frac{\partial Qi(VS)}{\partial VS}\right|_{VS=VSs}(VS-VSs)$$

When T=Ts, I=Is, and VS=VSs are substituted into Equation (20) above, Equation (24) shown below is obtained.

$$Qi(Ts, Is, VSs, VE) = \quad (24)$$
$$Qi(Ts, Is, VSs, VEs) + \left.\frac{\partial Qi(VE)}{\partial VE}\right|_{VE=VEs}(VE-VEs)$$

Figure 14A:
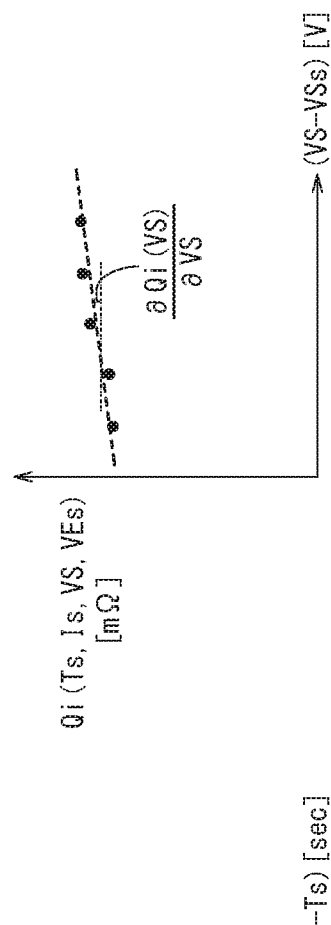
FIG. 14A is a graph showing the relationship between the battery temperature difference and the capacity.
Figure 14C:
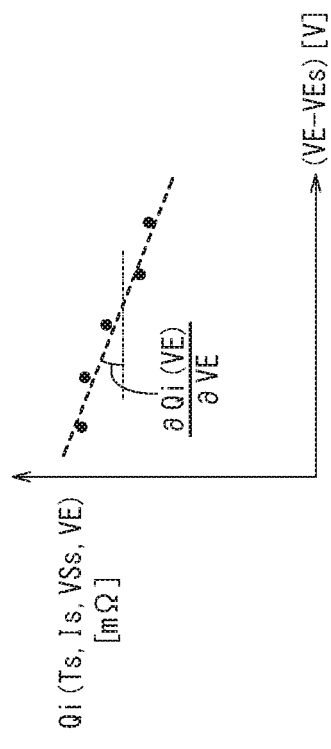
FIG. 14C is a graph showing the relationship between the charging start voltage difference and the capacity.
Figure 14B:
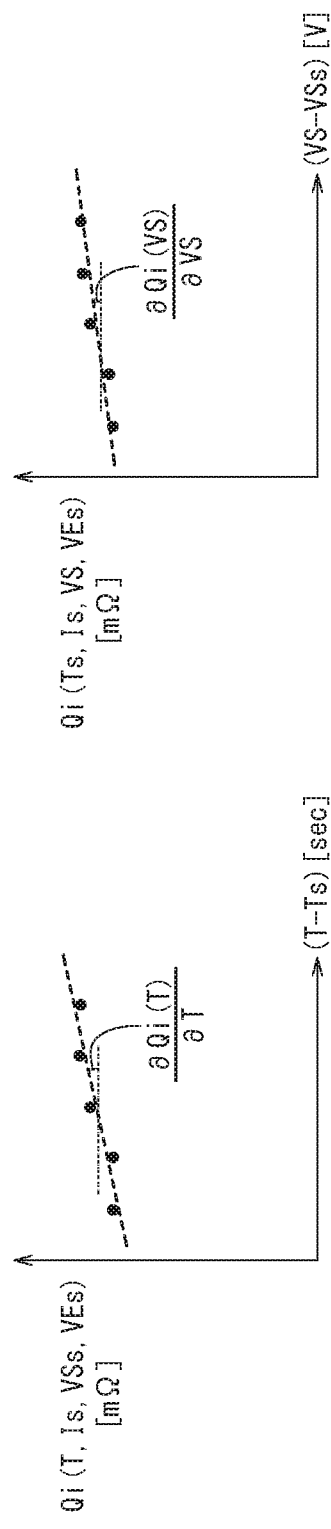
FIG. 14B is a graph showing the relationship between the charging current difference and the capacity.
Figure 14D:
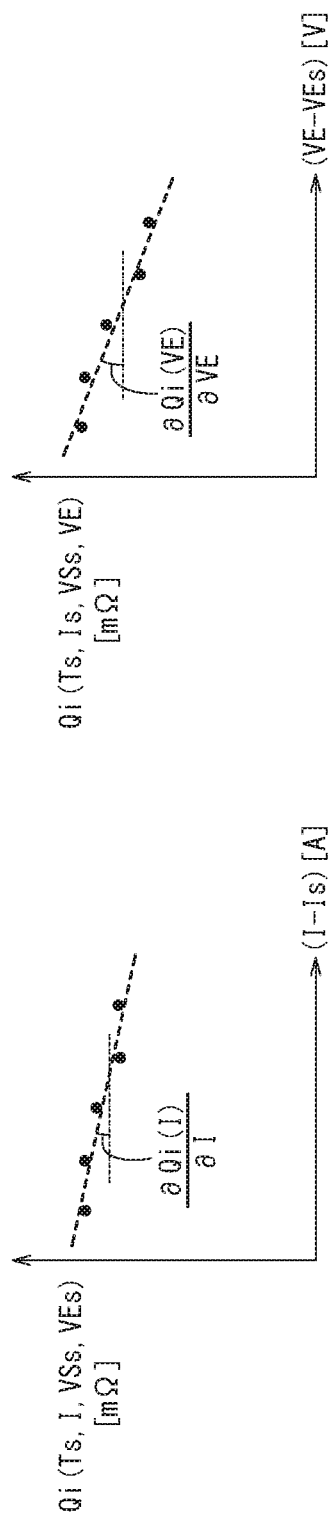
FIG. 14D is a graph showing the relationship between the charging end voltage difference and the capacity.

FIG. 14A is a graph showing the relationship between the battery temperature difference (T–Ts) and the capacity Qi (T, Is, VSs, VEs). FIG. 14B is a graph showing the relationship between the charging current difference (I–Is) and the capacity Qi (Ts, I, VSs, VEs). FIG. 14C is a graph showing the relationship between the charging start voltage difference (VS–VSs) and the capacity Qi (Ts, Is, VS, VEs). FIG. 14D is a graph showing the relationship between the charging end voltage difference (VE–VEs) and the capacity Qi (Ts, Is, VSs, VE).

When the charging current condition is fixed at the charging current Is, the charging start voltage condition is fixed at the charging start voltage VSs, the charging end voltage condition is fixed at the charging end voltage VEs, and the battery temperature condition is changed, data concerning the capacity Qi (T, Is, VSs, VEs) relative to the battery temperature difference (T–Ts) is acquired, as shown in FIG. 14A. The acquired capacity Qi (T, Is, VSs, VEs) is approximated by a linear function in which the battery temperature difference (T–Ts) is a variable. The slope of this linear function corresponds to the battery temperature correction coefficient.

When the battery temperature condition is fixed at the battery temperature Ts, the charging start voltage condition is fixed at the charging start voltage VSs, the charging end voltage condition is fixed at the charging end voltage VEs, and the charging current condition is changed, data concerning the capacity Qi (Ts, I, VSs, VEs) relative to the charging current difference (I–Is) is acquired, as shown in FIG. 14B. The acquired capacity Qi (Ts, I, VSs, VEs) is approximated by a linear function in which the charging current difference (I–Is) is a variable. The slope of this linear function corresponds to the charging current correction coefficient.

When the battery temperature condition is fixed at the battery temperature Ts, the charging current condition is fixed at the charging current Is, the charging end voltage condition is fixed at the charging end voltage VEs, and the charging start voltage condition is changed, data concerning the capacity Qi (Ts, Is, VS, VEs) relative to the charging start voltage difference (VS–VSs) is acquired, as shown in FIG.

14C. The acquired capacity Qi (Ts, Is, VS, VEs) is approximated by a linear function in which the charging start voltage difference (VS−VSs) is a variable. The slope of this linear function corresponds to the charging start voltage correction coefficient.

When the battery temperature condition is fixed at the battery temperature Ts, the charging current condition is fixed at the charging current Is, the charging start voltage condition is fixed at the charging start voltage VSs, and the charging end voltage condition is changed, data concerning the capacity Qi (Ts, Is, VSs, VE) relative to the charging end voltage difference (VE−VEs) is acquired, as shown in FIG. 14D. The acquired capacity Qi (Ts, Is, VSs, VE) is approximated by a linear function in which the charging end voltage difference (VE−VEs) is a variable. The slope of this linear function corresponds to the charging end voltage correction coefficient.

An equation obtained by substituting the battery temperature correction coefficient, the charging current correction coefficient, the charging start voltage correction coefficient, and the charging end voltage correction coefficient into Equation (13) is the capacity calculation formula, and it is possible to correct the capacity Qd (Ta, Ia, VSa, VEa) of the battery 10 that is the evaluation target and estimate the capacity Qd (Ts, Is, VSs, VEs) using this capacity calculation formula.

[Estimation of the Evaluation Internal Resistance Rd (Ts, Is, Vs)]

FIG. 15 is a chart used to estimate the evaluation internal resistance Rd (Ts, Is, Vs) from the evaluation internal resistance Rd (Ts, Is, Va). For the description in FIG. 15, each column is labeled with a character A to L.

Information concerning the battery 10 in the initial state is input to columns B to F. The information concerning the battery 10 in the initial state is already known through experimentation or the like, and is therefore input in advance. Here, a description is provided in which the capacity Qi (Ts, Is, VSs, VEs) is 4.0 Ah and the battery voltage Vs is 50 V.

The battery voltage V corresponding to each SOC for the battery 10 in the initial state is input to column B. The battery voltage V corresponding to each SOC can be obtained from the SOC-battery voltage map of FIG. 13.

The discharge capacity DCQi is input at a location, in column C, corresponding to each SOC for the battery 10 in the initial state. The discharge capacity DCQi for each SOC is obtained by multiplying the capacity Qi (Ts, Is, VSs, VEs) of the evaluation target battery 10 by (1−SOC/100).

The ratio DCQi/Qi of the discharge capacity DCQi to the capacity Qi (Ts, Is, VSs, VEs) is input at a location, in column D, corresponding to each SOC for the battery 10 in the initial state.

The initial internal resistance Ri (Ts, Is, V) corresponding to each battery voltage V for the battery 10 in the initial state is input to column E. The ratio of the initial internal resistance Ri (Ts, Is, V) corresponding to each battery voltage V to the initial internal resistance Ri (Ts, Is, Vs) for the battery 10 in the initial state is input to column F as X1.

Information concerning the evaluation target battery 10 is input to columns G to L. The information concerning the evaluation target battery 10 is input based on information acquired while the battery 10 is being charged by the battery charger 14. Here, a description is provided in which the capacity Qd (Ts, Is, VSs, VEs) is 2.0 Ah, the battery voltage Va is 55 V, and the evaluation internal resistance Rd (Ts, Is, Va) is 10 mΩ.

The battery voltage V corresponding to each SOC for the evaluation target battery 10 is input to column G. The relationship between the battery voltage V and the SOC of the evaluation target battery 10 is assumed to be the same as the relationship between the battery voltage V and the SOC of the battery 10 in the initial state, and can be obtained from the SOC-battery voltage map of FIG. 13.

The discharge capacity DCQd is input at a location, in column H, corresponding to each SOC for the evaluation target battery 10. The discharge capacity DCQd for each SOC is obtained by multiplying the capacity Qd (Ts, Is, VSs, VEs) of the evaluation target battery 10 by (1−SOC/100).

The ratio DCQd/Qi of the discharge capacity DCQd of the evaluation target battery 10 to the capacity Qi (Ts, Is, VSs, VEs) of the battery 10 in the initial state is input at a location, in column I, corresponding to each SOC for the evaluation target battery 10.

A value in column D that is equal to the value in column I is searched for, and the value in column F corresponding to this value in column D is input to column K as X2. More specifically, a value "0.20" of SOC=80% in column D that is equal to the value "0.20" of SOC=60% in column I is found. The value "0.56" in column F corresponding to this value "0.20" in column D is input as the value for SOC=60% in column K. In the same manner, the values for each SOC of 100%, 80%, 40%, 20%, and 0% in column K are input. The values for each remaining SOC of 90%, 70%, 50%, 30%, and 10% in column K are input as values calculated by interpolation from the values for each SOC of 100%, 80%, 60%, 40%, 20%, and 0% in column K.

An evaluation internal resistance Rd (Ts, Is, Va) of 10 mΩ is input as the value corresponding to the battery voltage Va of 55 V in column J. Then, the ratio of each value in column K to the X2 value of 0.56 corresponding to the battery voltage Va of 55 V in column K is input as Y into column L.

Finally, values obtained by multiplying the evaluation internal resistance Rd (Ts, Is, Va) of 10 mΩ by the value of each Y in column L are input to column J. The "11 mΩ", which is the value for the battery voltage Vs of 50 V in column J obtained in this manner, corresponds to the evaluation internal resistance Rd (Ts, Is, Vs).

[Operational Effect]

In the present embodiment, the evaluation internal resistance Rd (Ts, Is, Va) in a situation where the battery temperature condition and the charging current condition are each a standard value is estimated, from the evaluation internal resistance Rd (Ta, Ia, Va) acquired in a situation during charging where each condition has a condition value other than the standard value, based on an internal resistance calculation formula obtained using a Taylor-expansion. Furthermore, the evaluation internal resistance Rd (Ts, Is, Vs) in a situation where the battery temperature condition is a standard value is estimated from the evaluation internal resistance Rd (Ts, Is, Va). In this way, it is possible to estimate the evaluation internal resistance Rd (Ts, Is, Vs) of the evaluation target battery 10 while taking into consideration the conditions during charging of the battery 10, without requiring progress information during use of the battery 10.

Furthermore, in the present embodiment, the capacity Qd (Ts, Is, Vs) of the battery 10 that is an evaluation target is estimated, and the evaluation internal resistance Rd (Ts, Is, Vs) is estimated from the evaluation internal resistance Rd (Ts, Is, Va) based on the estimated Qd (Ts, Is, Vs) and the capacity Qi (Ts, Is, Vs) of the battery 10 in the initial state that is acquired in advance. In this way, it is possible to estimate the evaluation internal resistance Rd (Ts, Is, Vs) of the evaluation target battery 10 while taking into consideration the conditions during charging of the battery 10, without requiring progress information during use of the battery 10.

LIST OF REFERENCE NUMERALS

10: battery
12: electric motorcycle
14: battery charger
16: battery charging device
18: control apparatus

What is claim is:

1. An internal resistance estimating method, comprising:
   an internal resistance acquiring step of acquiring an internal resistance of a first secondary battery when a first condition has a first value that is different from a predetermined first standard value and when a second condition has a second value that is different from a predetermined second standard value, wherein the first and second conditions are different conditions;
   a first internal resistance estimating step of, correcting the internal resistance by estimating an intermediate internal resistance of the first secondary battery in which the first condition has the first standard value and the second condition has the second value, the intermediate internal resistance estimated using an internal resistance calculation formula obtained by regarding the internal resistance of the first secondary battery as a function in which the first condition is a variable and performing a Taylor-expansion on the function around the first standard value; and
   a second internal resistance estimating step of correcting the intermediate internal resistance by estimating a new internal resistance of the first secondary battery in which the first condition has the first standard value and the second condition has the second standard value, the new internal resistance estimated based on an estimated capacity of the first secondary battery and on a capacity acquired in advance for a second secondary battery, wherein the second secondary battery has same specifications as the first secondary battery and a shorter usage period than the first secondary battery.

2. The internal resistance estimating method according to claim 1, wherein
   the internal resistance calculation formula includes at least a first-order partial differential term.

3. The internal resistance estimating method according to claim 1, wherein
   the internal resistance acquiring step includes acquiring the internal resistance of the first secondary battery based on a charging current when the first secondary battery is being charged and one charging voltage of the first secondary battery from among a charging start voltage and a charging end voltage,
   the first condition is at least one of a temperature and the charging current of the first secondary battery at a timing when the internal resistance of the first secondary battery is acquired, and
   the second condition is the voltage used when acquiring the internal resistance of the first secondary battery in the internal resistance acquiring step, from among the charging start voltage and the charging end voltage.

4. The internal resistance estimating method according to claim 1, wherein
   the internal resistance acquiring step includes estimating the internal resistance of the first secondary battery based on an internal resistance acquired in advance for the second secondary battery.

5. The internal resistance estimating method according to claim 1, comprising:
   a capacity estimating step of estimating the estimated capacity of the first secondary battery.

6. The internal resistance estimating method according to claim 5, comprising:
   a capacity acquiring step of acquiring a capacity of the first secondary battery when a third condition has a third condition value that differs from a predetermined third standard value, wherein
   the capacity estimating step includes correcting the capacity of the first secondary battery acquired in the capacity acquiring step by estimating the estimated capacity in which the third condition has the third standard value using a capacity calculation formula obtained by regarding the capacity of the first secondary battery as a function in which the third condition is a variable and performing a Taylor-expansion on the function around the third standard value.

7. The internal resistance estimating method according to claim 6, wherein
   the capacity calculation formula includes at least a first-order partial differential term.

8. The internal resistance estimating method according to claim 6, wherein
   the capacity acquiring step includes acquiring the capacity of the first secondary battery based on the charging current, the charging start voltage, and the charging end voltage, and
   the third condition is at least one of a temperature, the charging current, the charging start voltage, and the charging end voltage of the first secondary battery at a timing when the capacity of the first secondary battery is acquired.

9. The internal resistance estimating method according to claim 1, wherein
   the first secondary battery is a lithium-ion battery.

10. A secondary battery charging device that uses the internal resistance estimating method according to claim 1 to estimate an internal resistance of a first secondary battery.

* * * * *